United States Patent [19]

Dickman et al.

[11] Patent Number: 4,464,824
[45] Date of Patent: Aug. 14, 1984

[54] EPITAXIAL CONTACT FABRICATION PROCESS

[75] Inventors: John E. Dickman; Raymond A. Turi, both of Miamisburg; James A. Topich, Centerville, all of Ohio

[73] Assignee: NCR Corporation, Dayton, Ohio

[21] Appl. No.: 409,193

[22] Filed: Aug. 18, 1982

[51] Int. Cl.$^3$ .......................................... H01L 21/22
[52] U.S. Cl. .................................. 29/576 E; 29/578; 29/590
[58] Field of Search ................... 29/571, 576 E, 578, 29/590, 591; 357/23; 148/187, 1.5

[56] References Cited

U.S. PATENT DOCUMENTS 4,272,881 6/1981 Angle .................................. 29/571
4,294,002 10/1981 Jambotkar et al. ................. 29/571

FOREIGN PATENT DOCUMENTS

WO82/02283 7/1982 PCT Int'l Appl. ................... 29/571

Primary Examiner—L. Dewayne Rutledge
Assistant Examiner—S. Kastler
Attorney, Agent, or Firm—J. T. Cavender; Casimer K. Salys

[57] ABSTRACT

A process for fabricating an electrical contact which connects an epitaxial layer, well, or substrate with a metallic interconnect layer during the course of creating active integrated circuit devices in a semiconductor wafer. The process forms self-aligned contacts by establishing the contact locations coincident with the definition of the active regions, at an early step in the wafer fabrication process. Thereafter, a gate silicon dioxide layer and a polycrystalline silicon electrode layer are combined to mask the contact region surface from intermediate process environments, e.g., ion implantation and POCl$_3$ diffusion operations. As the wafer fabrication process approaches conclusion, the contact region is opened by a selective etch of the polycrystalline silicon and the silicon dioxide layers, an enhancement implant into the surface of the contact region, a hydrogen environment annealing operation, and a deposition and patterning of the metallic interconnect layer.

10 Claims, 21 Drawing Figures

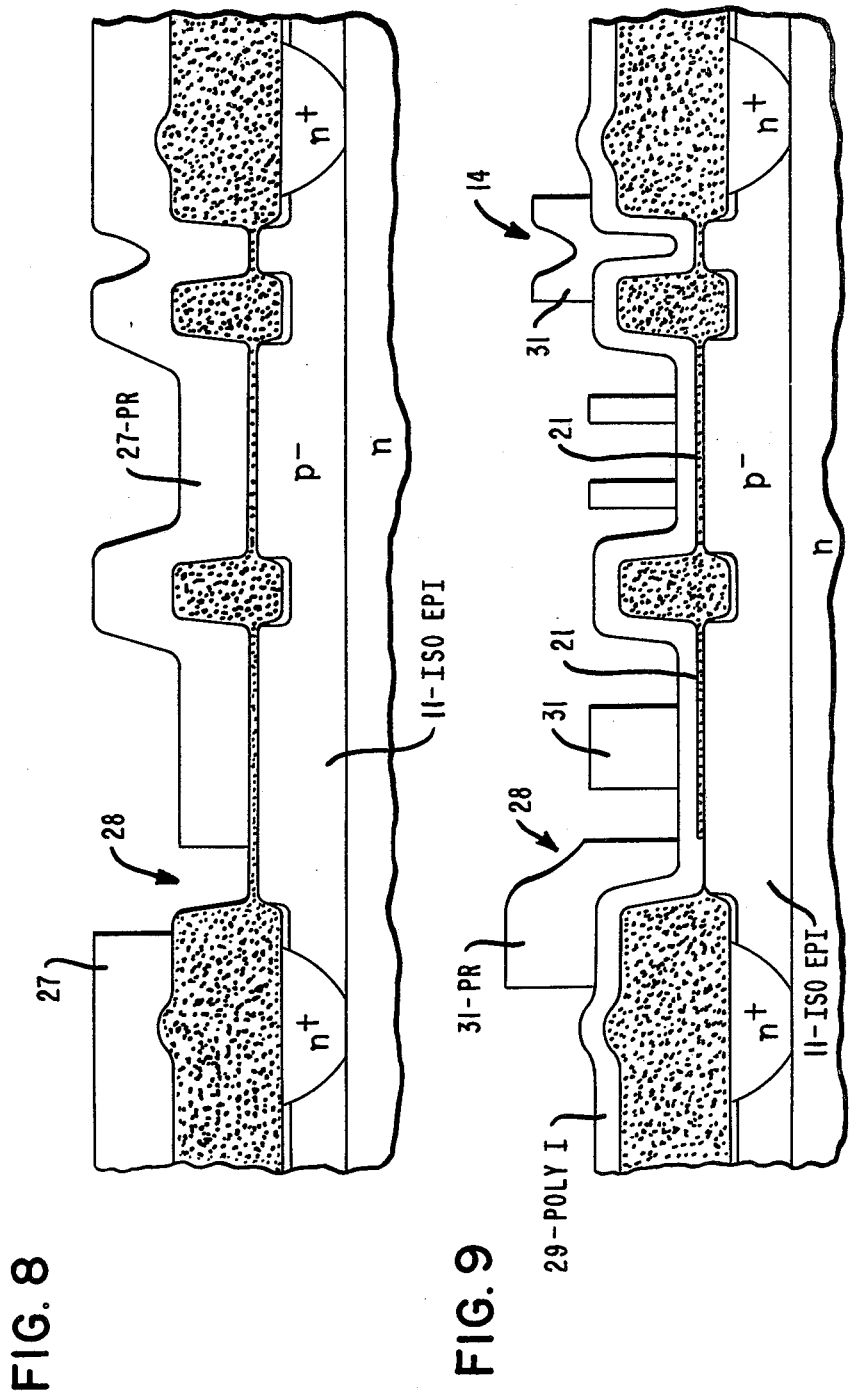

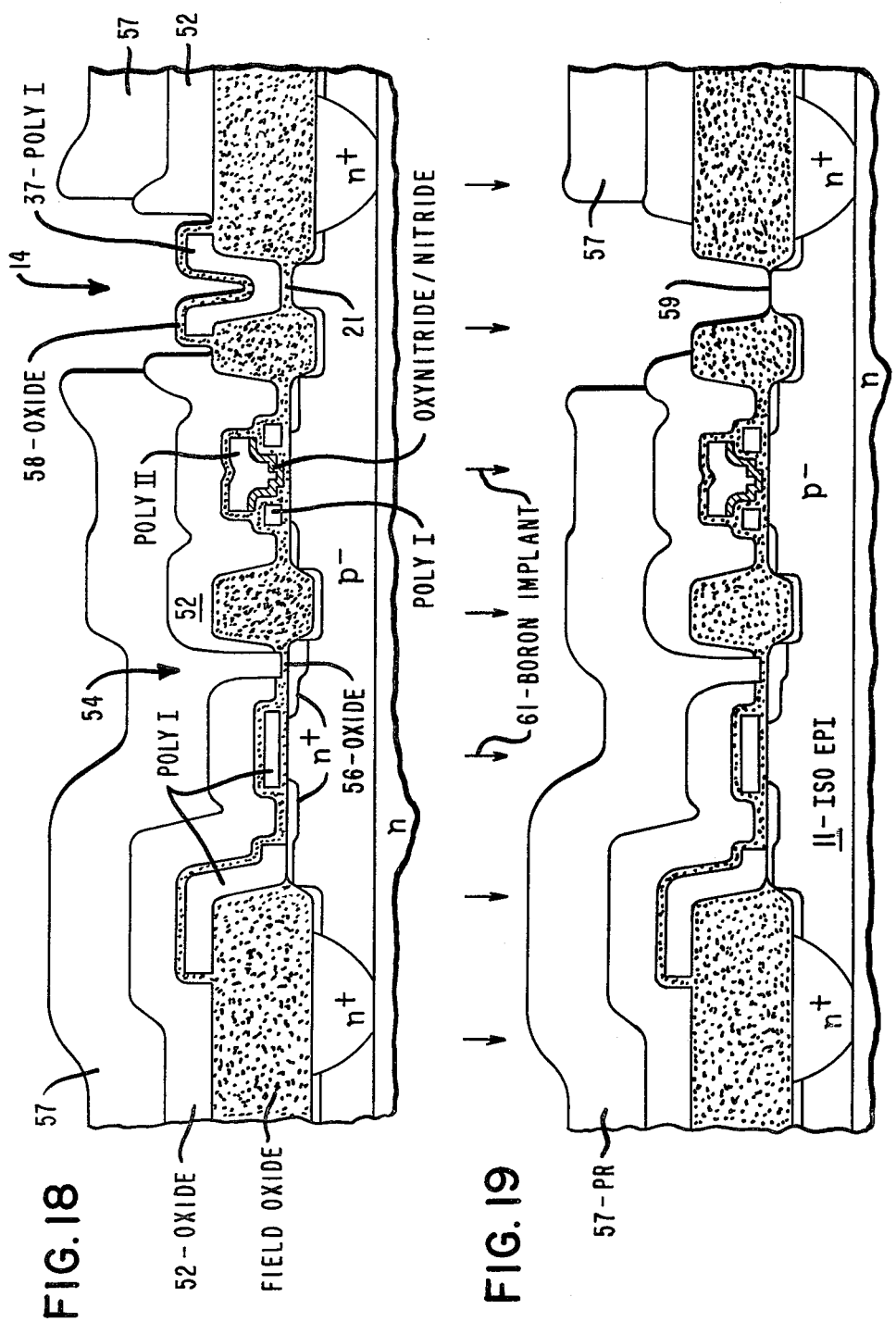

EPITAXIAL CONTACT FABRICATION PROCESS

BRIEF SUMMARY

The present invention relates to a process for making electrical contacts which connect epitaxial (epi) layers, diffusions, or the substrate to metallic interconnect layers during the fabrication of integrated circuits on a semiconductor wafer. In a preferred manner of its practice, the invention is directed to a sequence of steps for creating a reliable contact between a lightly doped epi layer and a metal aluminum-silicon composition interconnect layer in an integrated circuit fabricated with one or more intermediate polycrystalline silicon (poly) electrode layers. The invention features a sequence of steps which create a self-aligned contact structure separated from adjacent active areas by relatively thick silicon dioxide formations (field oxides). In particular, the process steps provide for direct masking of the epi contact region during source/drain (S/D) diffusions into the epi layer.

According to one embodiment, the epi contact region is defined at an early stage in the wafer process, substantially coincident with the delineation of the active and field oxide regions on the wafer surface. After the formation of the field oxides and gate oxide layer, a first electrode layer of polycrystalline silicon (poly I) is deposited and then photolithographically defined to cover the epi contact region. The poly I covering is oxidized, etched and reoxidized during succeeding process steps while serving to protect the underlying contact region and retaining the initial alignment position. Fabrication of the epi contact concludes with an sequence of selective etches to remove the poly and oxide layers, an enhancement implant of the exposed contact region, a hydrogen environment annealing operation, and a deposition and patterning of the metallic interconnect layer.

These and other novel aspects of the present invention will become clearer upon considering the ensuing description of the preferred embodiment.

BRIEF DESCRIPTION OF THE DRAWINGS

FIGS. 1-21 schematically illustrate cross-sections of the wafer structure at successive stages during the fabrication of active devices and contacts in an epi layer.

DETAILED DESCRIPTION

The composite process to which the present embodiment applies features the use of double level poly and metallic electrodes for fabricating field effect transistors (FETs), silicon-nitride-oxide semiconductor (SNOS) devices, and interconnecting contacts in an electrically isolated epi layer of a semiconductor wafer. The particular features of the composite process are explicitly enumerated in the copending U.S. patent application having Ser. No. 352,734, by inventors Dham et al. and assigned to the assignee of the present invention. The focus of the present embodiment is directed to the formation of reliable electrical contacts between the metallic and epi layer materials without departing significantly from the steps of the aforementioned composite process.

The need for an electrically isolated epi layer arises from the use of relatively high voltages, usually in excess of 20 volts, to "write" or "erase" the SNOS nonvolatile memory devices. The prevailing standard of 5 volts as the nominal supply voltage available to semiconductor chips requires that the higher voltages be generated and controlled on the chip itself. The use of an epi layer allows the isolation of the high voltage from other active devices on the common chip. However, if the threshold shift problems associated with a floating epi are to be suppressed, or control voltages are to be coupled into the epi layer, it is necessary to form an ohmic contact between the epi layer and the metallic interconnect layer.

Figure 1:
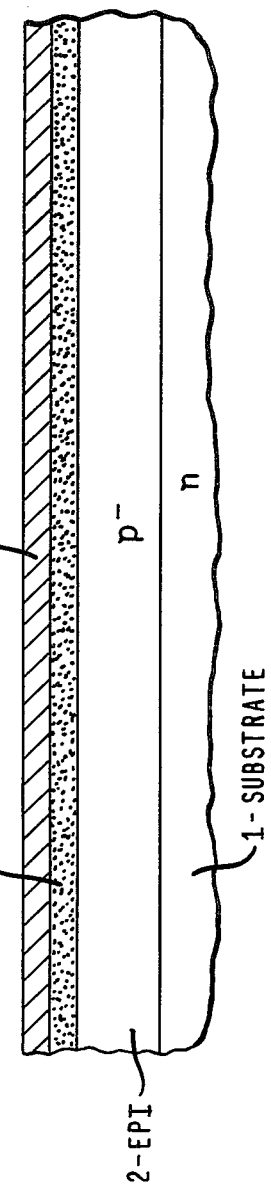

To understand how these objectives are accomplished through a unified sequence of process steps, attention is now directed to the cross-sectional schematics beginning with FIG. 1 of the drawings. The unique refinements to the basic SNOS process referenced hereinbefore will be explicitly noted as they arise during the development of the preferred composite process.

Fabrication of the semiconductor devices begins with an n-type substrate 1, having a <100> cut and a resistivity of 2-3 ohm-cm. A p-type epi layer, 2, of 15-20 ohm-cm resistivity is grown on the substrate to a thickness of 15-18 microns. Though the growth process itself is conventional, the presently prescribed thickness has been selected to constrain the current gain in the parasitic npn bipolar device formed by the combination of the shallow n+ doped source/drain regions in the epi, the p− doped epi and the n− doped substrate. Epi layer 2 is itself covered by layer 3, approximately 550 Angstroms of pad silicon dioxide (oxide). The final layer, 4, is a low pressure chemical vapor deposition (LPCVD) of silicon nitride (nitride) having a thickness of approximately 1100 Angstroms. The thickness of the nitride layer includes approximately 400 Angstroms which will eventually be converted to oxynitride and removed during a deglaze operation.

Figure 2:
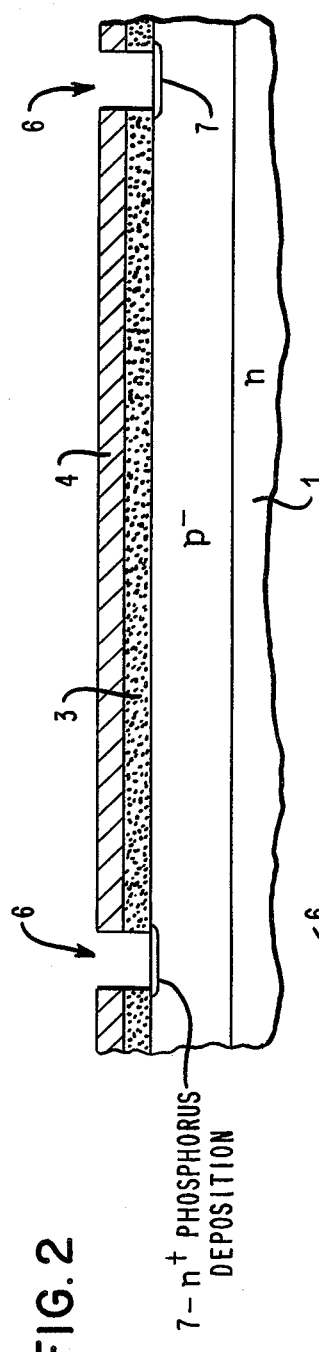

FIG. 2 depicts the wafer cross-section at another stage in the fundamental SNOS process. As depicted, the wafer has undergone a photolithographic pattern definition using a photoresist layer (not shown) defined by mask #1, an etch of nitride layer 4 and oxide layer 3 at locations 6 with appropriate etchants (plasma or wet depending on availability and the size of the geometry sought), a removal of the residual photoresist, a phosphorus-oxygen-trichloride (POCl$_3$) deposition of phosphorus, and a deglaze with buffered HF. After the deglaze, the remaining nitride is approximately 700 Angstroms thick. The phosphorus deposition is depicted in FIG. 2 by n+ doped regions 7 in epi layer 2. Regions 7 encircle and thereby define the segment of epi layer 2 which will eventually be electrically isolated.

Figure 3:
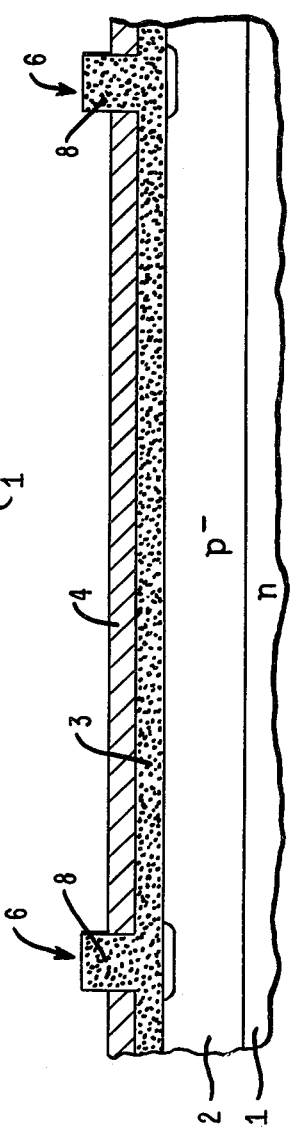

As illustrated by FIG. 3, the wafer is thereafter subjected to an isolation oxidation step, by which approximately 1,000 Angstroms of oxide 8 is grown at locations 6 from phosphorus doped epi regions 7. The last step ensures that doped epi regions 7 will be adequately protected during the immediately succeeding operations. Oxide 8 prevents the formation of nitride pits which commonly form in the high temperature nitrogen environment utilized to diffuse the phosphorus in region 7 through epi layer 2. Likewise, oxide 8 acts as a mask during the plasma etching of nitride layer 4.

Figure 4:
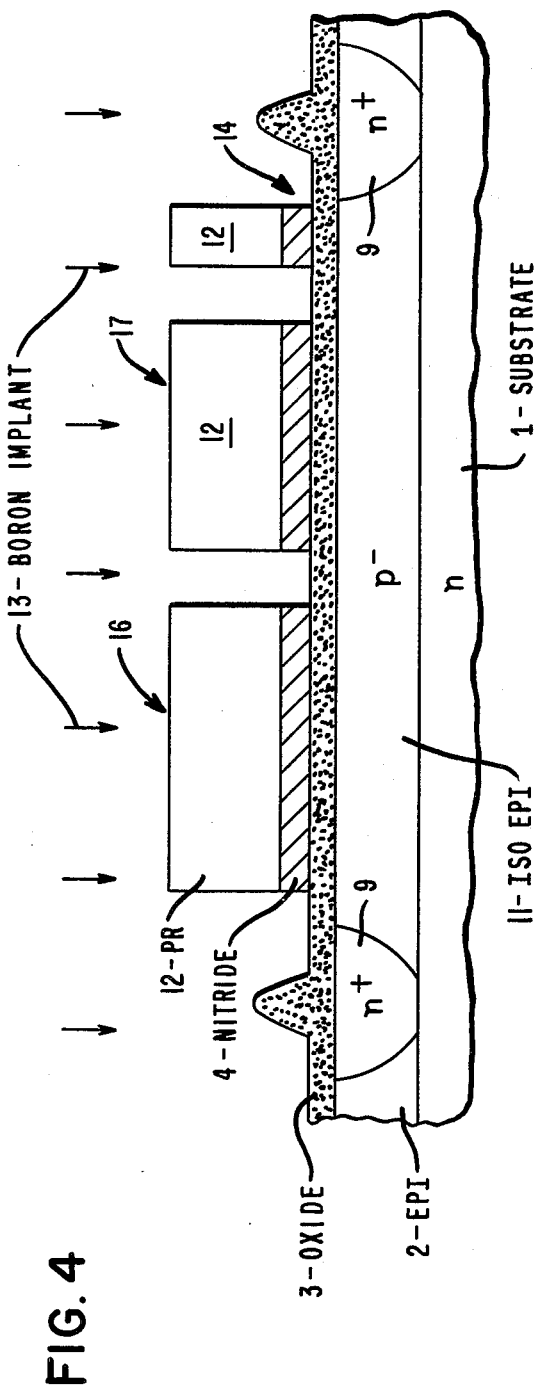

FIG. 4 illustrates the structure of the wafer cross-section at a succeeding step in the fabrication process. As shown, n+ doped epi regions 7 have been diffused to form regions 9, which extend completely through epi layer 2. This diffusion process creates an electrically isolated region or segment of epi layer 2, hereafter referred to as the isolated epi (iso epi) 11. Given the thickness of epi layer 2, the particular process parameters for accomplishing the isolation drive step are well known by those who routinely practice in the art.

The structure in FIG. 4 also shows the effects of photolithographic processing on photoresist (PR) layer 12 with mask #2, followed in order by a nitride etch operation. The PR patterns the ion implant of boron 13 into the field regions. Again, the process parameters are conventional.

It is at this point in the fabrication process that the initial refinements necessary for the practice of the present invention are first introduced. In particular, the epi contact location, 14 is delineated in mask #2 as if it were an active region to retain a covering of PR layer 12 and nitride layer 4. Note that the coextensive PR and nitride layers also define two other active regions in the iso epi layer, 11, generally located by reference numerals 16 and 17 in FIG. 4.

Figure 5:
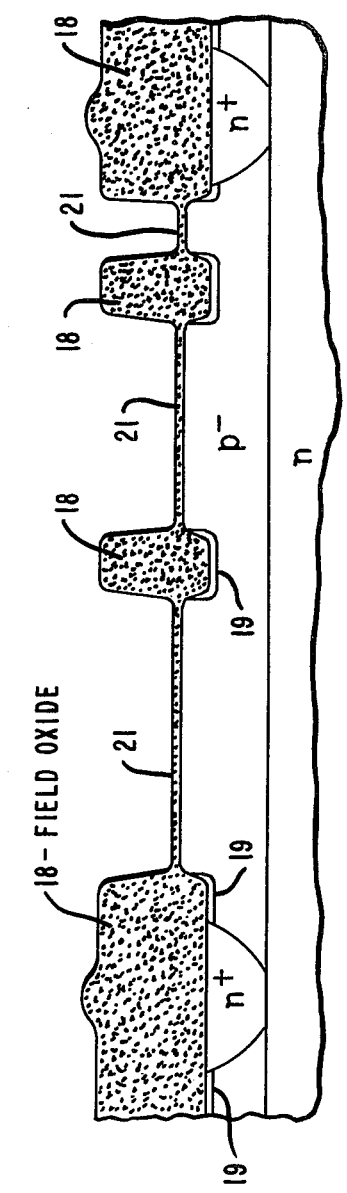

For a number of the succeeding steps, the process again follows the general sequence characterizing the above-noted copending patent application. Looking to FIG. 5, the cross-section is shown at the conclusion of a group of processing steps, including, a field oxidation, a nitride etch, a pad oxide etch, and a gate oxide growth. In conventional manner, the approximately 18,000 Angstroms of field oxide 18 is grown on exposed substrate silicon not covered by the patterned nitride 4 (FIG. 4). During the growth of the field oxide, the boron impurity implanted previously is driven into the silicon beneath the field oxide regions, as generally designated by reference numeral 19. After the above prescribed nitride and pad oxide etches, the wafer is subjected to a conventional oxidation adequate to grow approximately 775 Angstroms of clean gate oxide 21 in each active region.

Figures 6, 7:
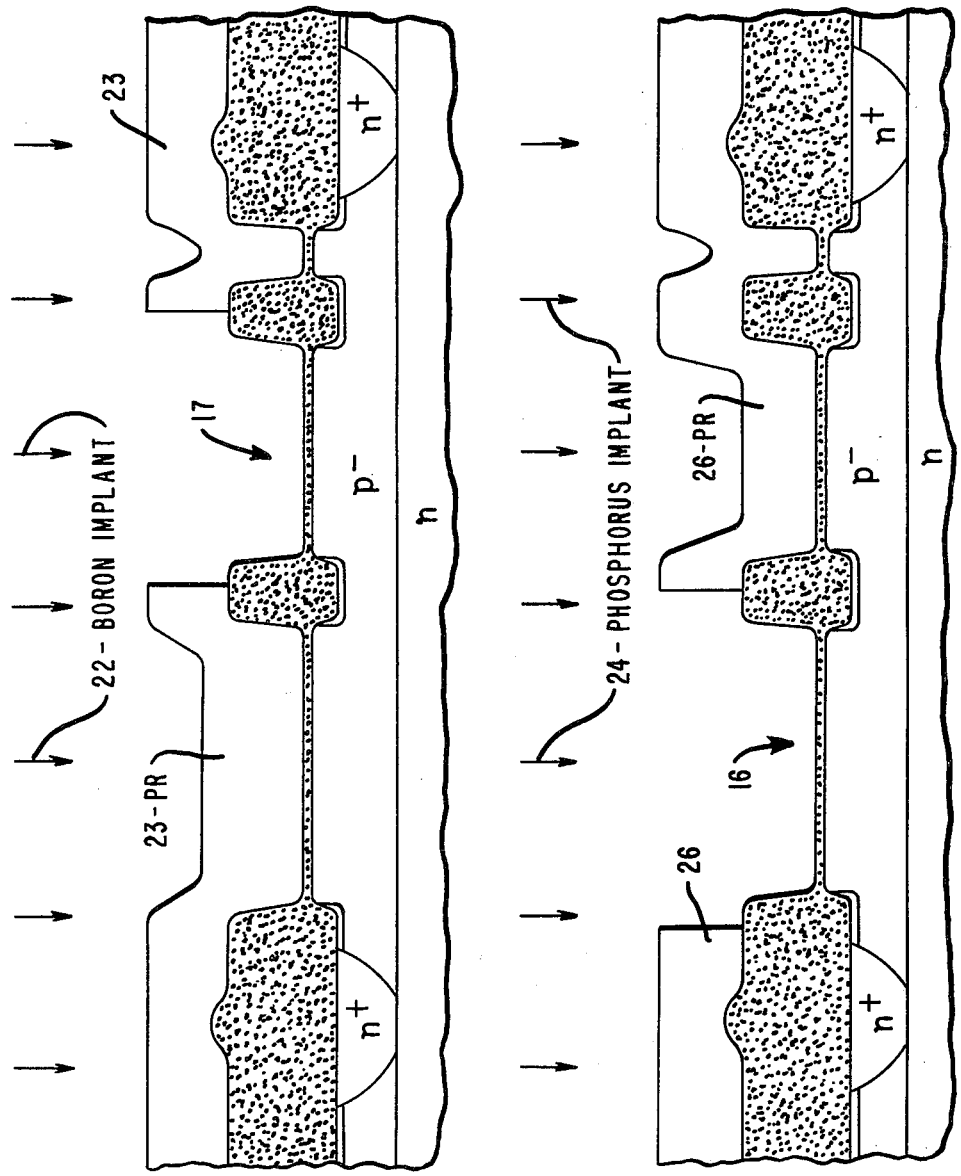

FIG. 6 illustrates the enhancement implant with boron, generally 22, into active region 17, after using photolithographically processed mask #3 to pattern PR layer 23. As is well-known, this step adjusts the threshold characteristics of the enhancement mode FET to be formed in active region 17.

FIG. 7 depicts the succeeding implant, 24, a phosphorus impurity into active region 16. The implant pattern is defined by PR layer 26 using process mask #4. In the manner of the immediately preceding implant, the phosphorus impurity adjusts the threshold characteristics of the depletion mode FET to be formed in region 16.

The sequence of the embodying process includes the formation of a poly I contact to the S/D region of the FET to be formed in region 16. Referring to FIG. 8, PR layer 27 is shown after photolithographic processing with mask #5 to expose location 28, the position of the proposed poly I-to-S/D contact.

One should not confuse this contact with the metal-to-epi contact whose formation constitutes the feature of the present invention. Note that during the formation of the poly I-to-S/D contact, the poly I layer will be doped with n-type impurity, creating a p-n junction with respect to iso epi layer 11.

Proceeding toward the structure in FIG. 9, location 28 is subjected to an oxide etch using PR 27 as a mask. After PR 27 is removed, a poly I layer, 29, of approximately 4,500 Angstroms is deposited. Poly I layer 29 is then implanted with phosphorus to establish a sheet resistance suitable for the proposed poly resistors. Again, such processing is routinely performed by practitioners in the art. The final step, leading to the structure depicted in FIG. 9, involves a photolithographic definition of a pattern in PR layer 31 using mask #6.

It is with mask #6, and the pattern shown in FIG. 9, that the present process further deviates to allow the eventual formation of a low resistivity contact at location 14 to join iso epi layer 11 with a metallic interconnect layer. In particular, mask #6 ensures that PR 31 is retained over the poly I layer at location 14. The contributions of the retained poly will become evident as the process sequence evolves hereinafter.

Figures 10, 11:
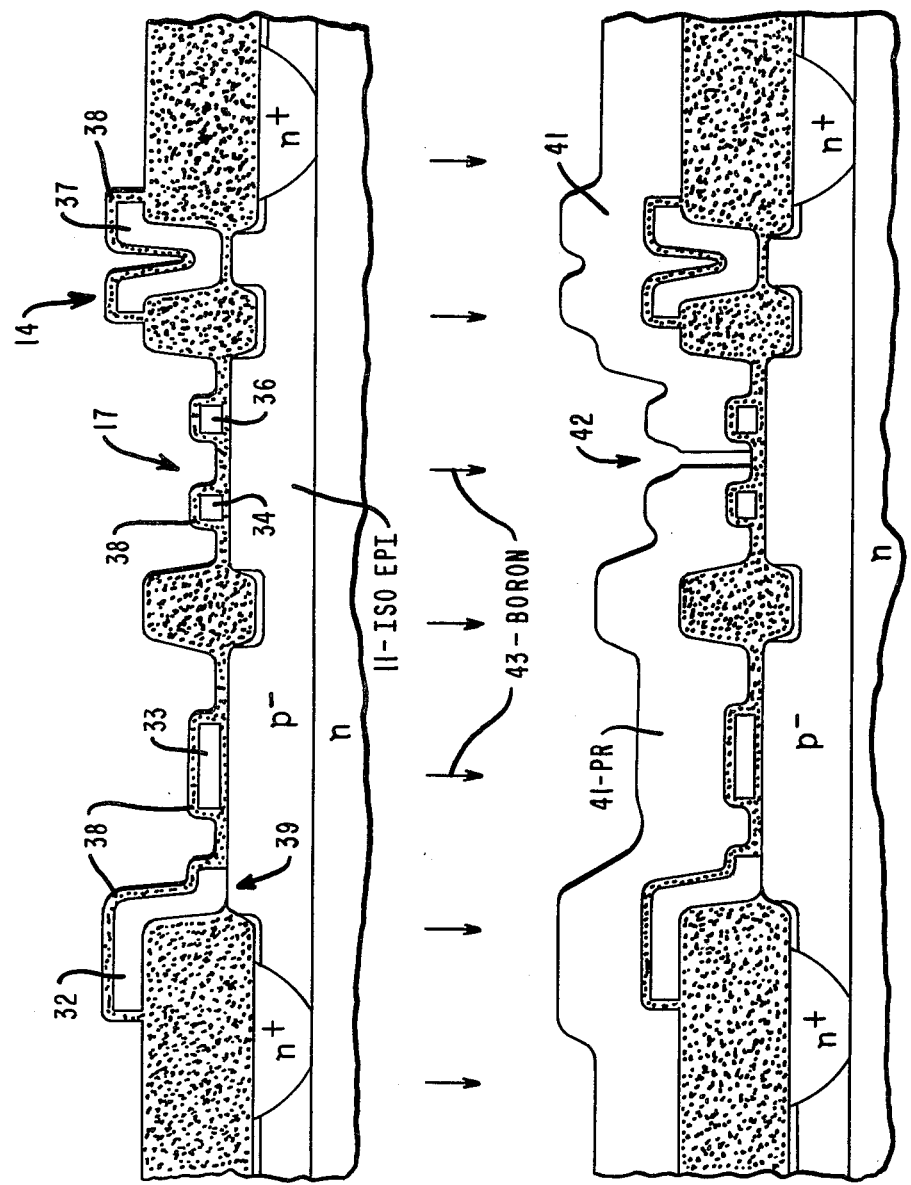

FIG. 10 illustrates the structure after the combination of an etch of the unmasked portions of poly I, a depletion implant, and a growth of isolation oxide. With greater particularity, the conventional poly I etch step is followed by a removal of PR 31 (FIG. 9) and a conventional blanket implant using phosphorus impurities. The purpose of the implant is to establish the threshold characteristics of the depletion FETs having poly II layer gate electrodes. The implant penetrates gate oxide layer 21 (FIG. 9) wherever the gate oxide is not covered by retained areas of poly I, such as poly I electrodes 32, 33, 34 and 36 in FIG. 10. Therefore, the channel characteristics beneath gate electrodes 33, 34 and 36 are not altered. The shielding effect of the poly I layer applies with equal effect to the poly I segment 37, covering the proposed metal-to-epi contact region. The steps leading to the fabrication of the structure in FIG. 10 are concluded with the growth of an isolation oxide, 38, of sufficient thickness to electrically isolate the poly I layer electrodes from the succeeding poly II layer electrodes. As embodied, the thickness of isolation oxide 38 is approximately 2,000 Angstroms over remaining poly I.

Note the direct contact between poly I electrode 32 and iso epi layer 11 at location 39. Succeeding process steps will form the poly-to-S/D contact sought. This structural arrangement is often referred to as a buried contact.

Figure 12:
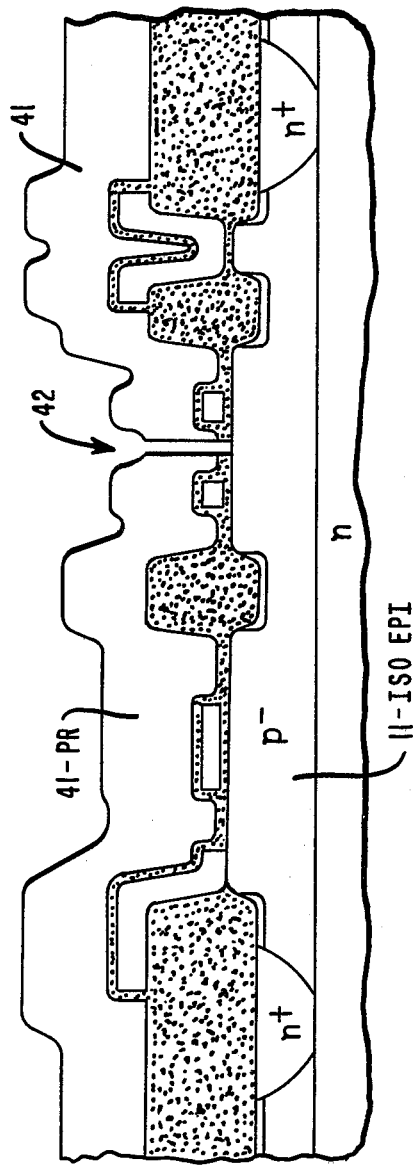

FIGS. 11 and 12 depict processing steps particularly directed toward the preparation of the SNOS type nonvolatile (NV) memory device, performed substantially according to the procedure described in the above noted copending patent application. FIG. 11 shows a PR layer, 41, photolithographically defined with mask #7 to position the SNOS memory FET at location 42, for the memory implant of boron 43 which follows. The boron establishes the threshold voltage of the SNOS memory FET. Thereafter, PR 41 prescribes the mask for etching the oxide layer at memory FET location 42. The oxide etch exposes the monocrystalline silicon surface of iso epi layer 11, as shown in FIG. 12.

Figure 13:
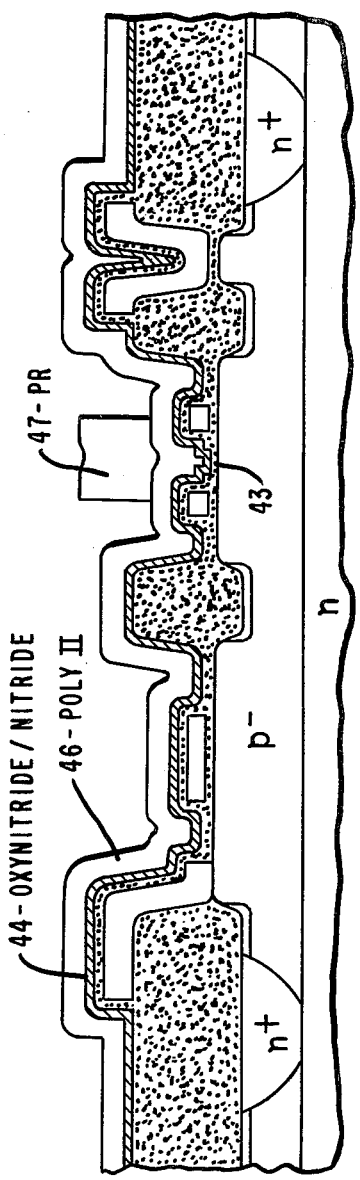

The oxide etch step is followed by a PR strip, the formation of the memory dielectric, a deposition of a poly II layer, and a photolithographic definition of the composite SNOS type NV memory device. Referring to FIG. 13, formation of the memory dielectric is generally a three step process, which is described in copending U.S. patent application having Ser. No. (2955-B) by inventor Romano-Moran and assigned to the assignee of the present invention. The novel process entails the growth of a thin memory oxide, approximately 20 Angstroms thick, followed by the growth of approximately 40 Angstroms of oxynitride and approximately 340 Angstroms of nitride in a single, continuous furnace operation. The outcome is generally depicted in FIG. 13 by memory oxide 43 and oxynitride/nitride composite layer 44. A 3,000 Angstrom deposition of poly II, 46, follows, which layer is itself covered by PR pattern 47 defined by photolithographic mask #8.

Figure 14:
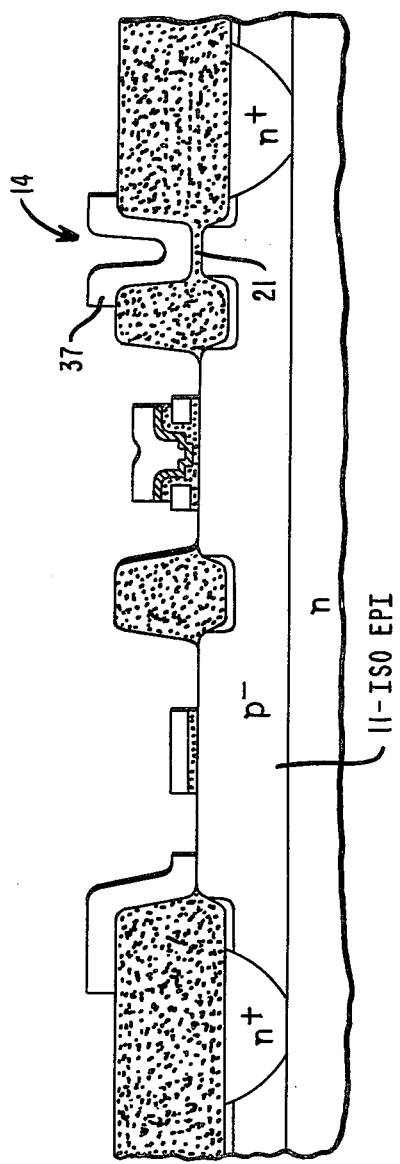

Using PR pattern 47, the structure in FIG. 13 is subjected to a sequence of etches in progressing to the cross-section shown in FIG. 14. The objective of the steps is to expose the poly electrodes and the S/D regions in iso epi layer 11 for succeeding diffusion doping operations. Note that the specific sequence of layers and materials types establishes a progression of appropriate etchant stops. At the conclusion of the poly II, nitride and oxide etches, the wafer structure appears as shown in FIG. 14.

It is evident from FIG. 14 that poly I layer segment 37, at the location of the metal-to-epi contact, also remains intact at the conclusion of the selected etch sequence, thereby masking gate oxide layer 21 at location 14 from the succeeding oxide etchants.

Care must be exercised in the selection of etchants to ensure that the preferential etch rates are consistent with the progression of materials serving as etchant stops. For purposes of the present embodiment, a suitable choice is a planar plasma using $SF_6$ followed by $C_2ClF_5$ (Freon 115) to etch both poly II layer 46 and oxynitride/nitride layer 44. The remaining oxide is then removed with 7:1 buffered HF.

Figure 15:
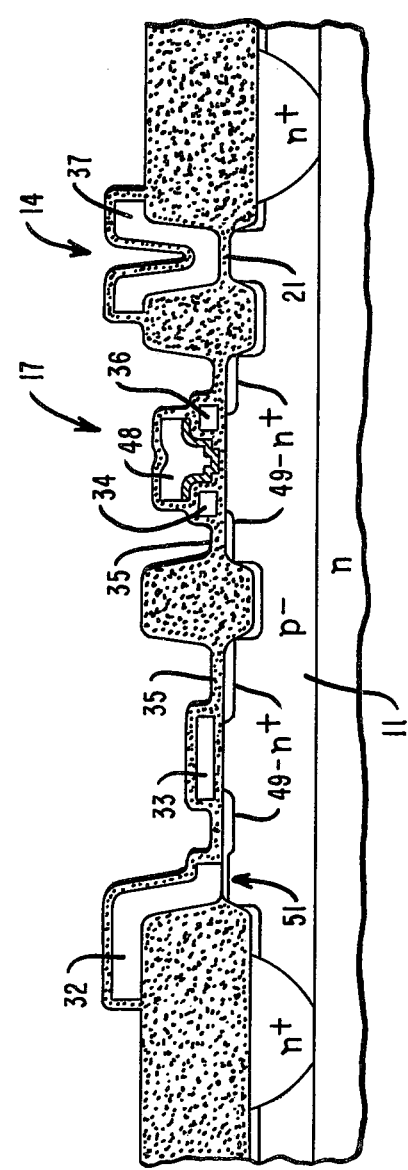

The structure in FIG. 15 modifies that in FIG. 14 by the operation of two further fabrication steps, a $POCl_3$ deposition of n-type dopant and a second isolation oxidation. Referring to FIG. 15, the $POCl_3$ dopes poly I interconnect electrode 32, poly I mask 37, poly II gate electrode 48, and poly I gate electrodes 33, 34 and 36. Simultaneously, the deposition creates $n^+$-type S/D diffusions 49 in $p^-$ iso epi layer 11. The buried poly I contact formation at location 51 is now completed, by the diffusion of phosphorus through poly I electrode 32. The second isolation oxide layer, shown at 35 in FIG. 15, is thermally grown to be approximately 350 Angstroms on iso epi layer 11.

Since the features of the composite SNOS type NV memory device at location 17 are secondary to the present contact fabrication process, one seeking a detailed description thereof should consult copending U.S. patent application having Ser. No. 220,644, by inventors Lockwood and Trudel, and assigned to the assignee of the present invention.

Note, at this point, that the present metal-to-epi contact fabrication process ensures that no phosphorus dopant is diffused into iso epi layer 11 at contact 14. This occurs by virtue of the blocking effect created when poly I layer 37 is combined with gate oxide layer 21. In such an arrangement, the gate oxide layer is a significantly more efficient barrier against phosphorus diffusion into the surface of iso epi layer 11.

Figure 16:
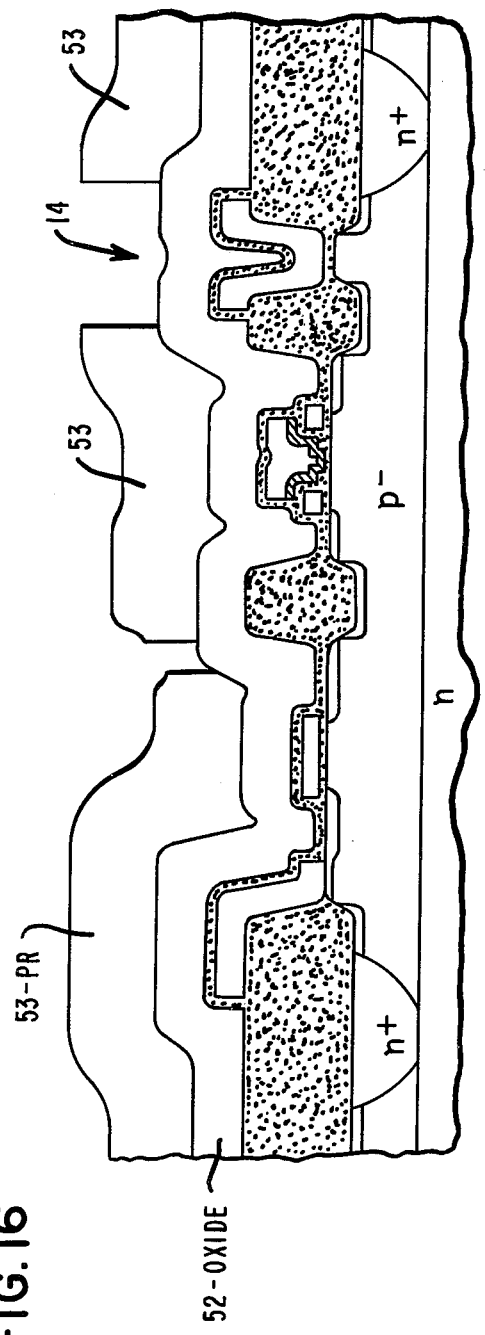

Attention is now directed to FIG. 16 of the drawings. As shown, the structure last depicted in FIG. 15 has been covered by approximately 10,000 Angstroms of low temperature deposited undoped oxide, 52. Oxide 52 is thereafter subjected to a densification step in generally known manner and further covered by photolithographically patterned PR layer 53. Note that the metal-to-epi contact at location 14 remains self-aligned from its inception. This permits greater tolerances in the alignment of mask #9, which is used to pattern PR layer 53.

Figure 17:
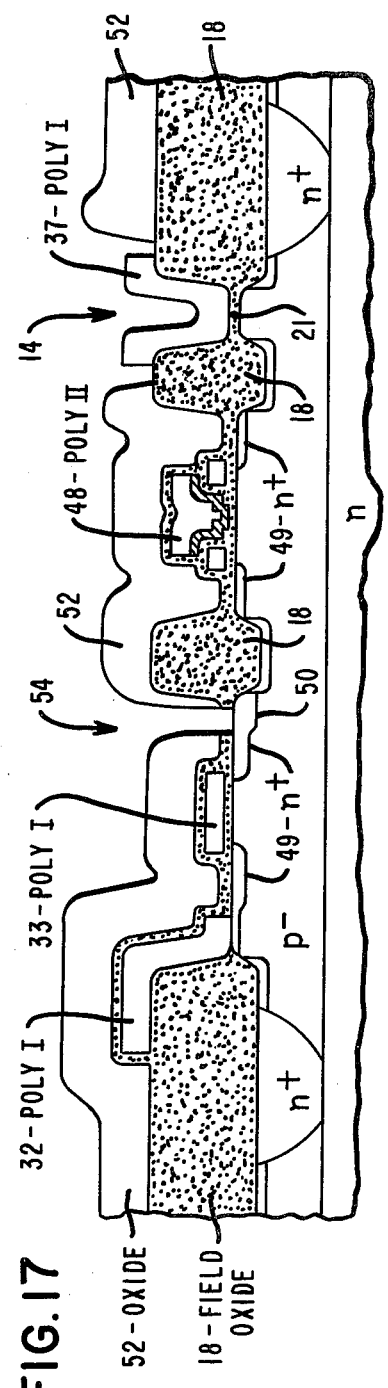

FIG. 17 illustrates the wafer cross-section after the effects of an oxide etch step using the pattern of PR layer 53. As is illustrated, the S/D diffusion at location 54 is exposed by the oxide etch operation, while the metal-to-epi contact at location 14 remains protected from oxide etchants by the masking effect of poly I layer 37. The relatively thick layer of oxide 52 is conveniently removed from location 14 when etching the contact opening at 54, through PR mask 53 could be patterned to defer the etch of location 14 until later in the process. The oxide etch is followed by a $POCl_3$ deposition of phosphorus to enhance the exposed S/D contact regions. The phosphorus impurity diffuses both into iso epi layer 11 and laterally beyond the metal-to-S/D opening at location 54. The lateral diffusion effectively relaxes mask alignment tolerances. The increased depth of the diffusion is visually evident at reference numeral 50 in FIG. 17. Thereafter, the wafer is subjected to a brief deglaze operation, which entails a blanket etch suitable to clean the S/D contact areas at locations such as 54.

To derive the structural cross-section appearing in FIG. 18, the arrangement of FIG. 17 is initially subjected to an oxidation adequate to grow approximately 250 Angstroms of oxide 56 from the exposed S/D region at location 54. This oxide prevents contamination of the S/D by sodium traces common in PR materials, a contaminant material which has been linked to threshold stability problems. Oxide 59, grown from poly I layer 37, is of no consequence. Upon the conclusion of the oxidation step, PR layer 57 is deposited and photolithographically processed with mask #10 to expose the region surrounding the metal-to-epi contact at location 14. Note that the opening in the PR is visibly larger than the previous PR openings at location 14, and is significantly larger than the contact region itself. This again illustrates the self-aligning feature of the present process, which feature allows a greater density of active components by increasing the magnitudes of the errors permissible for the mask alignment and fabrication processes.

Using the mask defined by PR layer 57, the wafer in FIG. 18 is taken through an etch sequence. The sequence begins with a wet etch of oxide 58 using 7:1 buffered HF, follows with a conventional wet or plasma etch of poly I layer 37, and is concluded with a wet etch of gate oxide layer 21 using 7:1 buffered HF. FIG. 19 shows the cross-section at the conclusion of the sequence. As was true in previously described sequences, the particular succession of etchants and materials defined serve as self-defining etchant stops, concluding with surface 59 of iso epi layer 11. Though the etching of thick oxide layer 52 could be deferred, as noted hereinbefore, until this sequence, there are no particular benefits while the risks of field oxide damage increase significantly.

To improve the contact between the metallic interconnect layer and the $p^-$ doped iso epi surface, the present invention includes a supplemental boron implant, 61. The implant removes any possibility of forming a parasitic diode at surface 59. A preferred implant has an energy of approximately 50 keV and a boron dose of approximately $1 \times 10^{15}$ atoms per square centimeter. The implant step can be eliminated if the metallic interconnect is formed from a suitable barrier material, i.e. a material that does not form a diode junction when connected to surface 59 of iso epi layer 11. That was not the case with metallic material utilized in the present embodiment.

The formation of the metal-to-epi contact is further enhanced by a hydrogen annealing operation performed on the wafer after PR layer 57 is stripped. The annealing step, done at approximately 900° C. for 30 minutes, removes implantation damage in surface 59 and activates the boron impurities therein. In the context of the complete wafer, the hydrogen annealing cycle also improves the device characteristics of poly I layer resistors and the SNOS type NV memory devices.

Figures 20, 21:
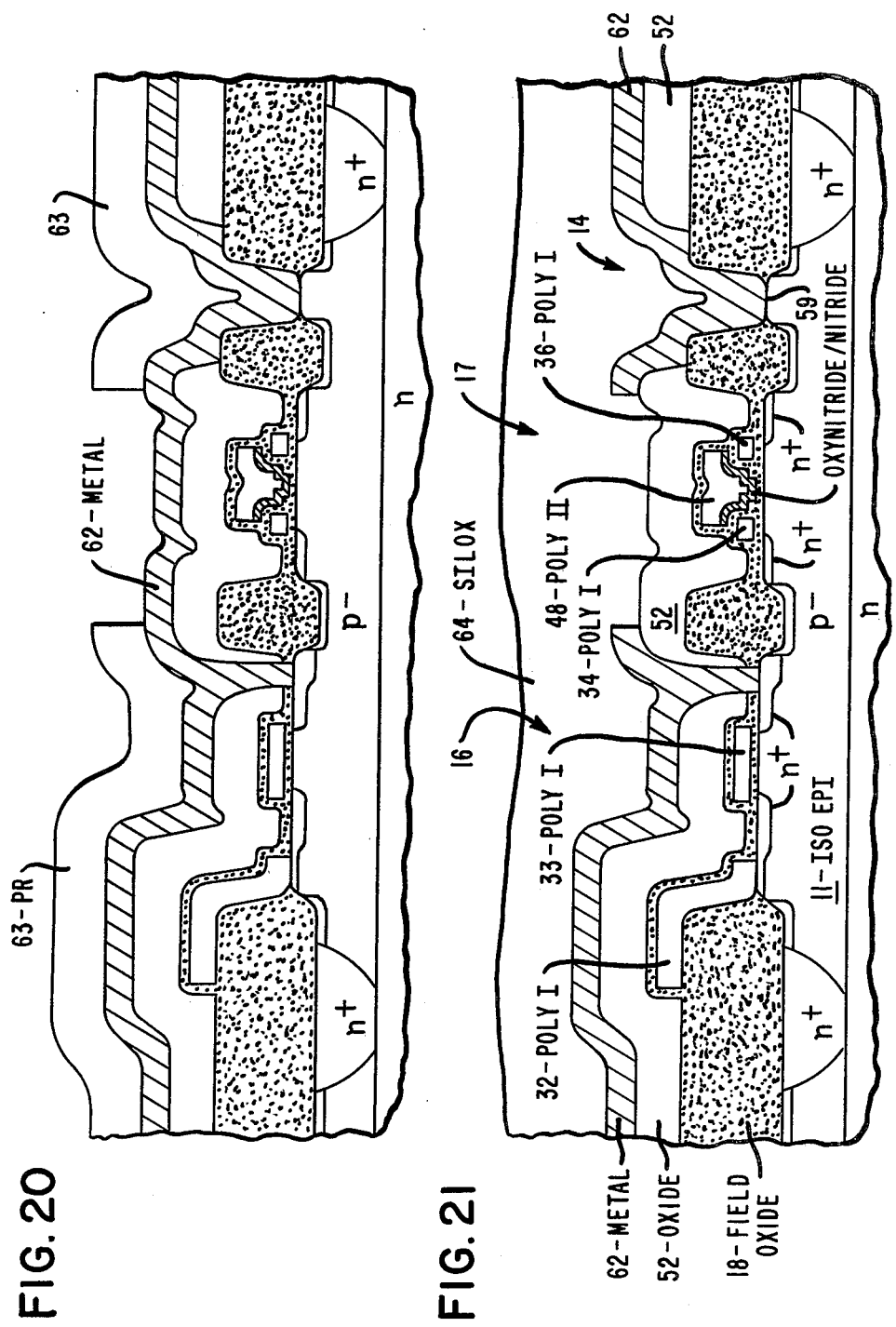

Attention is now directed to FIG. 20, where the wafer is shown after metal and PR depositions. To reach this stage of the processing, the annealed wafer is first subjected to a blanket, premetal contact etch in 20:1 buffered HF. The etch removes residual contaminants and thin oxide layer 56 (FIG. 18) at the site of the metal-to-S/D contact, location 54. As shown in FIG. 20, the etched structure is covered by a metal alloy layer, 62, composed of aluminum with approximately 1.2% silicon. The thickness of layer 62 is approximately 10,000 Angstroms. Metallic layer 62 is covered by PR layer 63, which is then patterned photolithographically using mask #11 to define the metal interconnect pattern.

FIG. 21 illustrates the cross-section of the completed device, after the conventional steps of metal etching, metal alloying, deposition of silox 64, and silox etching for chip pad definition. The contact formed between iso epi layer 11 and metal layer 62 at location 14 is immediately apparent. The completed structure in FIG. 21 also illustrates the effective isolation rendered by a segment of field oxide 18, to separate the metal-to-epi contact at 14 from the SNOS device at 17. The self-aligned character of the contact is also evidenced by the structure in FIG. 21, where the opening in oxide layer 52 is visibly wider than actual contact at surface 59 of iso epi layer 11. Moreover, the versatility of the present process is clearly illustrated by way of the whole embodiment, where the contact-making refinements are incorporated into a relatively complex process for simultaneously fabricating epitaxially isolated FETs, 16, and SNOS devices, 17, using multiple poly electrode layers and a metallic interconnect layer.

It will no doubt be appreciated that the metal-to-epi contact process described herein has a relatively broad range of potential applications. Therefore, it may be introduced into numerous types of related processes without departing from the fundamental tenets illustrated in the presently preferred embodiment. For instance, the features of the process apply with equal merit to the fabrication of metallic contacts to the substrate itself or wells formed in a substrate. These and a diversity of other variation remain within the scope and spirit of the present invention as claimed.

We claim:

1. In a process for fabricating an electrical contact between a region in a semiconductor wafer and a metallic interconnect layer during the course of fabricating an integrated circuit which generally includes the formation of active and field oxide regions, the creation of field effect devices using patterned formations of a gate dielectric layer and electrode material layers, the pattern doping of electrode and wafer layer materials, and the formation of electrical connections to said field effect devices, wherein the improvement comprises the selectively introduced steps of:

delineating said wafer to define a first contact region at a position electrically isolated from the source/drain regions of field effect devices;
   forming the field oxide while protecting said contact regions;
   forming a layer of first, gate dielectric material on said wafer to extend over said contact region;
   forming a first layer of first electrode material on said wafer to extend over said contact region;
   delineating said first layer of first electrode material to retain the area covering said first contact region;
   forming a first layer of second dielectric material on said wafer to extend over said first contact region;
   delineating an etch mask on said wafer to define said first contact region after the completion of the field effect devices, said mask exposing a region greater than said first contact region;
   sequentially etching through layers of dielectric and electrode materials; and
   forming a layer of metallic material on said wafer to extend over said contact region.

2. The process recited in claim 1, wherein said first contact region is defined in an epitaxial layer of said wafer.

3. The process recited in claim 1, wherein said first contact region is defined in a lightly doped well of said wafer.

4. The process recited in claim 1, wherein said first contact region is defined in a heavily doped diffusion of said wafer.

5. The process recited in claim 2, wherein said epitaxial layer is lightly doped with a first impurity type material and said metallic material is an aluminum-silicon composition; and wherein said process includes the additional steps of implanting first impurity type ions into said contact region to a concentration adequate to suppress parasitic p-n junctions, and annealing said wafer in a hydrogen environment, following said step of sequentially etching.

6. The process recited in claim 5, wherein said first and second dielectric materials are silicon dioxide and said first electrode material is polycrystalline silicon.

7. The process recited in claim 6, wherein said sequential etching is performed with etchant materials which are highly preferential in etching either silicon or silicon dioxide.

8. The process recited in claim 7, wherein said step of forming a layer of first dielectric material is followed by the additional steps of:

forming a second layer of second electrode material on said wafer;
   delineating said second layer of second electrode material to define active devices and interconnects; and
   forming a second layer of second dielectric material on said wafer.

9. The process recited in claim 8, wherein said step of delineating said second layer of second electrode material is followed by a diffusion of second impurity type dopant into defined electrode and wafer regions.

10. The process recited in claim 9, wherein said step of delineating an etch mask over said first contact region also delineates a second contact region for forming a contact to regions doped by diffusion, and includes the immediately succeeding additional steps of:

diffusing a second impurity type dopant into said second contact region;
   forming a relatively thin layer of silicon dioxide material on said second contact region; and
   delineating an etch mask to define said first contact region.

* * * * *